(12) United States Patent
Jacob et al.

(10) Patent No.: US 11,515,147 B2
(45) Date of Patent: Nov. 29, 2022

(54) MATERIAL DEPOSITION SYSTEMS, AND RELATED METHODS

(71) Applicant: Micron Technology, Inc., Boise, ID (US)

(72) Inventors: Clement Jacob, Boise, ID (US); Richard L. Elliott, Boise, ID (US); Christopher W. Petz, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/708,141

(22) Filed: Dec. 9, 2019

(65) Prior Publication Data
US 2021/0175072 A1    Jun. 10, 2021

(51) Int. Cl.
*H01L 21/02* (2006.01)
*H01L 21/285* (2006.01)
(Continued)

(52) U.S. Cl.
CPC .... *H01L 21/02205* (2013.01); *C23C 14/0036* (2013.01); *C23C 14/34* (2013.01);
(Continued)

(58) Field of Classification Search
CPC .......... H01L 21/02205; H01L 21/0262; H01L 21/02532; H01L 21/02631; H01L 21/2855; H01J 37/345; H01J 37/32082
See application file for complete search history.

(56) References Cited

U.S. PATENT DOCUMENTS

| 4,837,185 A | 6/1989 | Yau et al. |
| 4,999,096 A | 3/1991 | Nihei et al. |

(Continued)

FOREIGN PATENT DOCUMENTS

| CN | 101573778 A | 1/2013 |
| EP | 0848421 A2 | 6/1998 |
| TW | 201112313 A | 4/2011 |

OTHER PUBLICATIONS

Taiwanese First Office Action for Application No. 109143157, dated Jul. 29, 2021, 11 pages.
(Continued)

*Primary Examiner* — Aaron J Gray
(74) *Attorney, Agent, or Firm* — TraskBritt

(57) ABSTRACT

A material deposition system comprises a dopant source containing at least one dopant precursor material, an inert gas source containing at least one noble gas, and a physical vapor deposition apparatus in selective fluid communication with the dopant source and the inert gas source. The physical vapor deposition apparatus comprises a housing structure, a target electrode, and a substrate holder. The housing structure is configured and positioned to receive at least one feed fluid stream comprising the at least one dopant precursor material and the at least one noble gas. The target electrode is within the housing structure and is in electrical communication with a signal generator. The substrate holder is within the housing structure and is spaced apart from the target electrode. A method of forming a microelectronic device, a microelectronic device, a memory device, and an electronic system are also described.

20 Claims, 7 Drawing Sheets

(51) Int. Cl.
  *H01J 37/34* (2006.01)
  *H01J 37/32* (2006.01)
  *C23C 14/34* (2006.01)
  *C23C 14/35* (2006.01)
  *C23C 14/00* (2006.01)

(52) U.S. Cl.
  CPC ............ *C23C 14/35* (2013.01); *H01J 37/345* (2013.01); *H01L 21/0262* (2013.01); *H01L 21/02532* (2013.01); *H01L 21/02631* (2013.01); *H01L 21/2855* (2013.01); *H01L 21/28518* (2013.01); *H01J 37/32082* (2013.01)

(56) References Cited

U.S. PATENT DOCUMENTS

| | | | |
|---|---|---|---|
| 5,194,398 A | 3/1993 | Miyachi et al. | |
| 5,242,561 A | 9/1993 | Sato | |
| 5,252,194 A * | 10/1993 | Demaray | H01J 37/3408 204/192.12 |
| 5,510,011 A | 4/1996 | Okamura et al. | |
| 5,755,938 A | 5/1998 | Fukui et al. | |
| 6,080,285 A | 6/2000 | Liu et al. | |
| 6,344,419 B1 | 2/2002 | Forster et al. | |
| 6,409,890 B1 | 6/2002 | Grunes et al. | |
| 6,579,426 B1 | 6/2003 | van Gogh et al. | |
| 6,602,384 B2 | 8/2003 | Bhardwaj et al. | |
| 6,991,709 B2 | 1/2006 | Gopalraja et al. | |
| 8,460,519 B2 | 6/2013 | Ye et al. | |
| 8,580,076 B2 | 11/2013 | Becknell et al. | |
| 9,017,535 B2 | 4/2015 | Nagamine et al. | |
| 2003/0152867 A1 * | 8/2003 | Ichihara | G11B 7/266 430/270.13 |
| 2003/0186504 A1 | 10/2003 | Li et al. | |
| 2005/0136604 A1 | 6/2005 | Al-Bayati et al. | |
| 2006/0054494 A1 | 3/2006 | Reiss | |
| 2006/0081558 A1 | 4/2006 | Collins et al. | |
| 2006/0169584 A1 * | 8/2006 | Brown | C23C 14/358 204/298.12 |
| 2006/0264060 A1 | 11/2006 | Ramaswamy et al. | |
| 2006/0289853 A1 * | 12/2006 | Chen | B82Y 10/00 257/14 |
| 2007/0080059 A1 | 4/2007 | Takahashi | |
| 2008/0210973 A1 * | 9/2008 | Chen | H01L 33/32 438/45 |
| 2009/0273087 A1 | 11/2009 | French et al. | |
| 2010/0236918 A1 | 9/2010 | Imakita et al. | |
| 2010/0320456 A1 * | 12/2010 | Delahoy | H01L 21/02631 257/E21.47 |
| 2013/0102133 A1 * | 4/2013 | Sheng | C23C 16/24 438/478 |
| 2014/0110256 A1 | 4/2014 | Kaneko et al. | |
| 2015/0279635 A1 | 10/2015 | Subramani et al. | |

OTHER PUBLICATIONS

Taiwanese Search Report and Second Office Action from Taiwanese Application No. 109143157, dated May 3, 2022, 14 pages with English translation.

* cited by examiner

MATERIAL DEPOSITION SYSTEMS, AND RELATED METHODS

TECHNICAL FIELD

The disclosure, in various embodiments, relates generally to the field of microelectronic device design and fabrication. More specifically, the disclosure relates to material deposition systems, and to related methods, microelectronic devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs, facilitating fabrication and reducing costs.

One example of a microelectronic device is a memory device. Memory devices are generally provided as internal integrated circuits in computers or other electronic devices. There are many types of memory including, but not limited to, random-access memory (RAM), read only memory (ROM), dynamic random access memory (DRAM), synchronous dynamic random access memory (SDRAM), flash memory, and resistance variable memory. Non-limiting examples of resistance variable memory include resistive random access memory (RRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes a transistor and a memory storage structure. The transistor of the memory cell generally includes a channel region between a source region and a drain region, and a gate configured to electrically connect the source region and the drain region to one another through the channel region. The source region and the drain region of the transistor typically comprise a conductively doped semiconductive material, and the channel region typically comprises an undoped semiconductive material or an oppositely conductively doped (e.g., relative to the dopant conductivity type of the source/drain regions) semiconductive material. Current challenges related to transistor fabrication include achieving desirable dopant concentrations and dopant distributions in the source region, the drain region, and the channel region thereof, and reducing fabrication costs.

Two common processes forming the different regions (e.g., the source region, the drain region, and the channel region) of a transistor include physical vapor deposition (PVD), and chemical vapor deposition (CVD). Of the two, PVD has the advantage of relatively lower processing temperatures, relatively low cost source materials, and relatively high deposition rates. In a conventional PVD process, a glow discharge plasma is generated in an inert gas atmosphere by applying a radiofrequency (RF) or direct current (DC) potential across a two electrode assembly. Ions of the plasma travel to and collide with a conductively-doped semiconductive target structure to sputter (e.g., eject) neutral atoms of the conductively-doped semiconductive target structure. The sputtered atoms travel across the plasma and deposit on a substrate (e.g., a semiconductive wafer) to be coated. Unfortunately, conductively-doped semiconductive target structures can be challenging and costly to produce, and frequently lack sufficient dopant concentrations to achieve desirable (e.g., relatively heavy) dopant concentrations in the source region and the drain region of a transistor. In addition, creating a heterogeneous dopant distribution within the source region and the drain region of a transistor using conventional PVD systems and processes can be very complex, inefficient, and costly (e.g., requiring the use of multiple conductively-doped semiconductive target structures having different dopant concentrations than one another, as well as a prohibitively large number of processing steps).

A need, therefore, exists for new material deposition systems and methods of forming microelectronic devices, as well as for new microelectronic devices, memory devices, and electronic systems.

DETAILED DESCRIPTION

Figure 1:
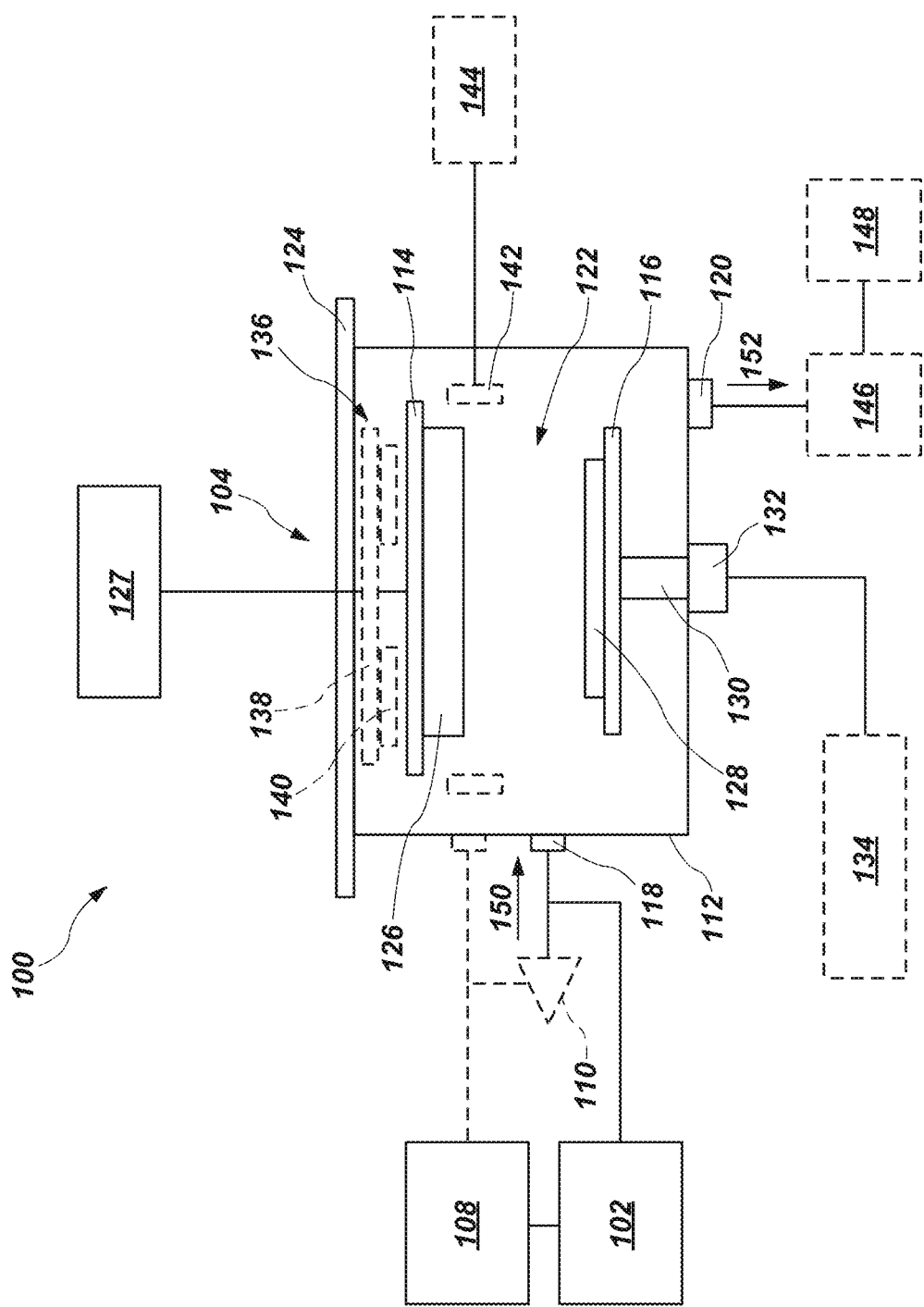
FIG. 1 is a simplified schematic view of a material deposition system, in accordance with an embodiment of the disclosure.

The following description provides specific details, such as material compositions and processing conditions (e.g., temperatures, pressures, flow rates, etc.) in order to provide a thorough description of embodiments of the disclosure. However, a person of ordinary skill in the art will understand that the embodiments of the disclosure may be practiced without necessarily employing these specific details. Indeed, the embodiments of the disclosure may be practiced in conjunction with conventional systems and methods employed in the industry. In addition, only those process components and acts necessary to understand the embodiments of the present disclosure are described in detail below. A person of ordinary skill in the art will understand that some process components (e.g., pipelines, line filters, valves, temperature detectors, flow detectors, pressure detectors, and the like) are inherently disclosed herein and that adding various conventional process components and acts would be in accord with the disclosure. Moreover, the description provided below does not form a complete process flow for manufacturing a microelectronic device. The structures described below do not form a complete microelectronic device. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, a "memory device" means and includes a microelectronic device exhibiting, but not limited to, memory functionality.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

An embodiment of the disclosure will now be described with reference to FIG. 1, which schematically illustrates a material deposition system 100 (e.g., a reactive sputtering system). The material deposition system 100 may be used to produce a microelectronic device structure including a doped semiconductive material (e.g., N-doped silicon (Si), such as N$^+$ Si; P-doped Si, such as P$^+$ Si) through physical vapor deposition (PVD) (e.g., reactive sputtering), as described in further detail below. As shown in FIG. 1, the material deposition system 100 may include at least one dopant source 102, and at least one PVD apparatus 104 in selective fluid communication with the dopant source 102. The material deposition system 100 may further include additional apparatuses operatively associated with one or more of the dopant source 102 and the PVD apparatus 104, as described in further detail below.

The dopant source 102 comprises at least one apparatus (e.g., containment vessel) configured and operated to contain (e.g., store) and/or produce at least one dopant precursor material to be used by the PVD apparatus 104 to produce a doped semiconductive material (e.g., N-doped Si, such as $N^+$ Si; P-doped Si, such as $P^+$ Si). In some embodiments, the dopant precursor material of the dopant source 102 comprises at least one N-type dopant precursor material, such as one or more of a phosphorus (P)-containing material, an arsenic (As)-containing material, an antimony (Sb)-containing material, and a bismuth (Bi)-containing material. In additional embodiments, the dopant precursor material of the dopant source 102 comprises at least one P-type dopant precursor material, such as one or more of a boron (B)-containing material, an aluminum (Al)-containing material, and a gallium (Ga)-containing material.

The dopant source 102 may be configured and operated to contain one or more of gaseous dopant precursor material, liquid dopant precursor material, and solid dopant precursor material. In some embodiments, the dopant source 102 is configured and operated to contain one or more gaseous dopant precursor materials (e.g., gaseous N-type dopant precursor materials, gaseous P-type dopant precursor materials). As a non-limiting example, the dopant source 102 may comprise a pressurized storage vessel configured and operated to hold a gaseous material comprising phosphine ($PH_3$) gas. In additional embodiments, the dopant source 102 is configured and operated to contain one or more liquid dopant precursor materials (e.g., liquid N-type dopant precursor materials, liquid P-type dopant precursor materials). As a non-limiting example, the dopant source 102 may comprise a storage vessel configured and operated to hold a liquid material comprising one or more of trimethylphosphine ($P(CH_3)_3$) liquid, tri-tert-butylphosphine liquid, and triethyl phosphate (($C_2H_5)_3PO_4$) liquid. In further embodiments, the dopant source 102 is configured and operated to contain one or more flowable solid dopant precursor materials (e.g., flowable solid N-type dopant precursor materials, flowable solid P-type dopant precursor materials). As a non-limiting example, the dopant source 102 may comprise a storage vessel configured and operated to hold a powder comprising solid particles of one or more dopant precursor materials, such as a powder comprising particles of red phosphorous.

With continued reference to FIG. 1, the material deposition system 100 may, optionally, further include at least one heating apparatus 106 operatively associated with the dopant source 102. The heating apparatus 106, if present, may comprise at least one apparatus (e.g., one or more of a heat exchanger, such as a tube-in-tube heat exchanger and/or a shell-and-tube heat exchanger; a combustion heater; a nuclear heater; a sonication heater; an electrical resistance heater; an inductive heater; an electromagnetic heater, such as an infrared heater and/or a microwave heater) configured and operated to heat at least a portion of the dopant source 102. The heating apparatus 106 may be employed to heat or maintain dopant precursor material of the dopant source 102 at a desired temperature, such as a temperature facilitating flowability of the dopant precursor material. In some embodiments, such as some embodiments wherein the dopant precursor material of the dopant source 102 comprises one or more of a liquid dopant precursor material and a solid (e.g., powder) dopant precursor material, the heating apparatus 106 is included in the material deposition system 100 and is configured and positioned to heat the dopant source 102. In some such embodiments, lines (e.g., piping, tubes) extending from and between the dopant source 102 and the PVD apparatus 104 are thermally insulated to maintain a desired temperature of at least one feed fluid stream directed from the dopant source 102 to the PVD apparatus 104. In additional embodiments, such as some embodiments wherein the dopant precursor material of the dopant source 102, does not require supplemental heating, the heating apparatus 106 is omitted from the material deposition system 100.

Optionally, a remote plasma generator may be included in the material deposition system 100 downstream of and in fluid communication with the dopant source 102. If present, the remote plasma generator may, for example, be configured and operated to dissociate (e.g., ionize) dopant precursor material exiting the dopant source 102 before the dopant precursor material is directed into the PVD apparatus 104.

Still referring to FIG. 1, the material deposition system 100 may further include at least one inert gas source 108 in fluid communication with the dopant source 102. The inert gas source 108 may comprise at least one apparatus (e.g., at least one pressure vessel) configured and operated to hold (e.g., contain, store) a volume of inert gas. The inert gas may, for example, comprise at least one noble gas, such as one or more of helium (He) gas, neon (Ne) gas, krypton (Kr) gas, xenon (Xe) gas, and argon (Ar) gas. Inert gas of the inert gas source 108 may be employed for physical sputtering of a target structure (e.g., a silicon target structure), as described in further detail below. For example, ions (e.g., Ar ions, He ions, Ne ions, Kr ions, Xe ions) of the inert gas generated within the PVD apparatus 104 may be employed to bombard the target structure and release atoms and/or molecules of target material. In some embodiments, inert gas of the inert gas source 108 may also be employed as a carrier gas for one or more dopant precursor materials (e.g., liquid dopant precursor materials, solid dopant precursor materials) contained within dopant source 102, as also described in further detail below.

The inert gas source 108 may be operatively associated with the dopant source 102 in a manner facilitating interaction (e.g., mixing) of inert gas from the inert gas source 108 with dopant precursor material from the dopant source 102 (or a derivative of the dopant precursor material, such as an ionized dopant precursor material exiting a remote plasma generator downstream of the dopant source 102) upstream of, at, and/or within the PVD apparatus 104. As a non-limiting example, the inert gas source 108 may be provided upstream of and in fluid communication with the dopant source 102, such that inert gas from the inert gas source 108 may be mixed with dopant precursor material of the dopant source 102 within and/or downstream of the dopant source 102. In some embodiments, the inert gas source 108 is configured and positioned such that inert gas exiting the inert gas source 108 is mixed with dopant precursor material of the dopant source 102 within dopant source 102. For example, the inert gas may be delivered into and mix with the dopant precursor material within at least one internal chamber of the dopant source 102. In additional embodiments, the inert gas source 108 and the dopant source 102 are each fluidly coupled to an optional mixing apparatus 110 downstream of the dopant source 102 and upstream of the PVD apparatus 104. Inert gas from the inert gas source 108 and dopant precursor material from the dopant source 102 may each be fed (e.g., flowed, pumped) into the mixing apparatus 110, wherein they may be combined ahead of the PVD apparatus 104. In some embodiments, the mixing apparatus 110 is configured and operated to form a gaseous mixture including discrete portions (e.g., discrete liquid droplets, discrete solid particles) of the dopant precursor material dispersed and entrained within the inert gas. For example, the mixing apparatus 110 may comprise an injector apparatus including an atomizing nozzle. In further embodiments, the mixing apparatus 110 is configured and operated to mix inert gas exiting the inert gas source 108 with a gaseous material exiting the dopant source 102. The gaseous material may, for example, include discrete portions (e.g., discrete liquid droplets, discrete solid particles) of dopant precursor material dispersed and entrained within a carrier gas. In yet further embodiments, the inert gas source 108 and the dopant source 102 are configured and positioned to direct materials (e.g., inert gas, dopant precursor material) held therein into the PVD apparatus 104 separate from one another (e.g., as two or more discrete feed fluid streams, such as a first feed fluid stream including inert gas exiting the inert gas source 108, and a second feed fluid stream including dopant precursor material exiting the dopant source 102).

With continued reference to FIG. 1, the PVD apparatus 104 is positioned downstream of and in selective fluid communication with the dopant source 102 and the inert gas source 108. The PVD apparatus 104 includes a housing structure 112, and each of at least one target electrode 114 and at least one substrate holder 116 within the housing structure 112. The target electrode 114 and the substrate holder 116 may be spaced apart (e.g., separated, distanced) from one another within housing structure 112. The PVD apparatus 104 may further include additional features (e.g., additional structures, additional devices), as described in further detail below.

The housing structure 112 of the PVD apparatus 104 exhibits at least one inlet 118 configured and positioned to receive at least one feed (e.g., influent) fluid stream comprising dopant precursor material from the dopant source 102 and inert gas from the inert gas source 108, and at least one outlet 120 positioned to direct at least one exhaust (e.g., effluent) fluid stream comprising reaction byproducts and unreacted materials from the PVD apparatus 104. The housing structure 112 may at least partially define at least one internal chamber 122 of the PVD apparatus 104. The internal chamber 122 may surround and hold the target electrode 114 and the substrate holder 116 of the PVD apparatus 104. The housing structure 112 may further include one or more sealable structures facilitating access to the internal chamber 122 to permit the insertion and removal of structures (e.g., target structures, substrates) into the internal chamber 122. By way of non-limiting example, as shown in FIG. 1, the housing structure 112 may exhibit a removable and sealable lid 124. The housing structure 112 may be formed of and include any material (e.g., metal, alloy, glass, polymer, ceramic, composite, combination thereof) compatible with the operating conditions (e.g., temperatures, pressures, material exposures, generated electrical fields, generated magnetic fields) of the PVD apparatus 104. In some embodiments, the housing structure 112 is formed of and includes stainless steel.

The target electrode 114 is configured and positioned to be provided adjacent (e.g., directly on) a target structure 126 within the internal chamber 122 of the PVD apparatus 104. In addition, the target electrode 114 of the PVD apparatus 104 may be configured to generate glow discharge upon the application of voltage thereto that may be employed to generate plasma from one or more feed fluid streams received by the PVD apparatus 104. The target electrode 114 may be electrically connected to at least one signal generator 127 of the material deposition system 100. The signal generator 127 may include at least one power source (e.g., a variable direct current (DC) power source, a pulsed direct current (PDC) source, a variable radio frequency (RF) power source). The signal generator 127 may also include additional components, such as at least one waveform modulator having circuitry configured for modulation of the waveform, frequency, and amplitude of output signals. As described in further detail below, the target electrode 114 may be configured and positioned such that negative bias applied thereto (with respect to generated plasma within the internal chamber 122 of the PVD apparatus 104) by the signal generator 127 accelerates ions (e.g., dopant ions, such as n-type dopant ions or p-type dopant ions; noble gas ions, such as He ions, Ar ions, Ne ions, Kr ions, and/or Xe ions) from the generated plasma toward the target structure 126 to interact (e.g., collide) with the target structure 126 and sputter (e.g., eject) material therefrom.

The substrate holder 116 is configured and positioned to support and temporarily hold at least one substrate 128 thereon. As shown in FIG. 1, the substrate holder 116 may be mounted on at least one rod structure 130 operatively associated with a motor assembly 132. The rod structure 130 and the motor assembly 132 may be configured and operated to adjust the location of the substrate holder 116 (and, hence, a substrate 128 thereon) between a relatively lower position (e.g., for loading and unloading the substrate 128) and a relatively higher position (e.g., for processing the substrate 128). Optionally, the substrate holder 116 may be electrically connected to at least one additional signal generator 134 of the material deposition system 100. The additional signal generator 134 may include at least one additional power source (e.g., DC power source, an RF power source, an alternating current (AC) power source). The additional signal generator 134 may also include additional components, such as at least one waveform modulator having circuitry configured for modulation of the waveform, frequency, and amplitude of output signals. As described in further detail below, the substrate holder 116 may be configured and positioned such that negative bias applied thereto (with respect to generated plasma within the internal chamber 122 of the PVD apparatus 104) by the additional signal generator 134 attracts ions of material sputtered from the target structure 126 toward the substrate 128 to form a material coating on or over the substrate 128. In additional embodiments, the additional signal generator 134 is omitted (e.g., absent) from the material deposition system 100, and external biasing of the substrate holder 116 of the PVD apparatus 104 is not employed during use and operation of the material deposition system 100.

With continued reference to FIG. 1, optionally, the PVD apparatus 104 may further include a magnet assembly 136 rotatably mounted within the internal chamber 122 thereof. As shown in FIG. 1, the magnet assembly 136 may be located above the target electrode 114 (and, hence, the target structure 126). The magnet assembly 136 may be part of a magnetron employed to create or augment a magnetic field adjacent the target structure 126. For example, the magnet assembly 136 (if present) may be configured and operated to produce a magnetic field that sweeps over the target structure 126 to promote uniform erosion by sputtering of the target structure 126. The magnetic field produced by the magnet assembly 136 may trap electrons, increase sputter rate of material from the target structure 126, maintain charge neutrality in plasma adjacent the target structure 126, and increase ion density of the plasma. In some embodiments, the magnet assembly 136 includes a rotatable platform 138 connected to an external drive motor, and magnets 140 coupled to (e.g., mounted to, attached to) the rotatable platform 138. The magnets 140 may intervene between the rotatable platform 138 and the target electrode 114 (and, hence, the target structure 126). In additional embodiments, the magnet assembly 136 is omitted (e.g., absent) from the PVD apparatus 104.

Still referring to FIG. 1, optionally, the PVD apparatus 104 may further include at least one coil structure 142 mounted between the target electrode 114 and the substrate holder 116 within the internal chamber 122 of the PVD apparatus 104. The coil structure 142 may be configured and operated to assist in generating and maintaining plasma between the target structure 126 and substrate 128. As described in further detail below, the coil structure 142 may be configured and operated to inductively couple energy into plasma produced within the internal chamber 122 to induce electromagnetic currents in the plasma. The electromagnetic currents may heat the plasma by Ohmic heating to sustain the plasma in a steady state. The electromagnetic currents may also facilitate relatively denser plasma, which may facilitate or enhance ionization of material sputtered from the target structure 126. As shown in FIG. 1, if present, the coil structure 142 may be electrically connected to at least one further signal generator 144 of the material deposition system 100. The further signal generator 144 may include at least one additional power source (e.g., an RF power source, a DC power source). The further signal generator 144 may also include additional components, such as an impedance-matching network. The coil structure 142 may act as first windings of a transformer. In additional embodiments, the coil structure 142 is omitted (e.g., absent) from the PVD apparatus 104.

Optionally, the material deposition system 100 may further include at least one vacuum apparatus 146 operatively associated with the outlet 120 in the housing structure 112 of the PVD apparatus 104. If present, the vacuum apparatus 146 may be configured and operated to assist with the control of pressure within the internal chamber 122 of the PVD apparatus 104, as well as the removal of reaction byproducts and/or unreacted materials (e.g., unreacted dopant precursor materials) from the internal chamber 122 of the PVD apparatus 104. The vacuum apparatus 146 may be configured and operated to apply negative pressure to the internal chamber 122 of the PVD apparatus 104. In additional embodiments, the vacuum apparatus 146 is omitted (e.g., absent) from the material deposition system 100.

Still referring to FIG. 1, the material deposition system 100 may, optionally, further include at least one effluent (e.g., exhaust) fluid treatment apparatus 148 operatively associated with the outlet 120 in the housing structure 112 of the PVD apparatus 104. If present, the effluent fluid treatment apparatus 148 may be configured and operated to treat (e.g., scrub) effluent fluid (e.g., exhaust gases) exiting the PVD apparatus 104 to at least partially remove one or more materials (e.g., toxic materials, hazardous materials, pollutants) therefrom. In some embodiments, the effluent fluid treatment apparatus 148 comprises a scrubber apparatus (e.g., a wet scrubber apparatus, a dry scrubber apparatus). In additional embodiments, the effluent fluid treatment apparatus 148 is omitted (e.g., absent) from the material deposition system 100.

Thus, in accordance with embodiments of the disclosures, a material deposition system comprises a dopant source containing at least one dopant precursor material, an inert gas source containing at least one noble gas, and a physical vapor deposition apparatus in selective fluid communication with the dopant source and the inert gas source. The physical vapor deposition apparatus comprises a housing structure, a target electrode, and a substrate holder. The housing structure is configured and positioned to receive at least one feed fluid stream comprising the at least one dopant precursor material and the at least one noble gas. The target electrode is within the housing structure and is in electrical communication with a signal generator. The substrate holder is within the housing structure and is spaced apart from the target electrode.

During use and operation of the material deposition system 100, the target structure 126 and the substrate 128 may be delivered into the PVD apparatus 104. The target structure 126 may have a geometric configuration (e.g., dimensions and shape) compatible with corresponding target support structures (e.g., target mounting structures) within the internal chamber 122 of the PVD apparatus 104 (e.g., attached to one or more portions of the housing structure 112, such as the lid 124 of the housing structure 112). In some embodiments, the target structure 126 exhibits a disk (e.g., plate) shape. In addition, the target structure 126 may have a desired material composition. The material composition of the target structure 126 may be selected at least partially based on the material composition of dopant precursor material to be delivered into the internal chamber 122 of the PVD apparatus 104, and a desired material composition of a microelectronic device structure (e.g., a sputtered material structure, such as a sputtered material coating, sputtered material film, a sputtered material layer) to be formed on, over, or within the substrate 128. In some embodiments, the target structure 126 is formed of and includes a substantially undoped semiconductive material, such as substantially undoped silicon (e.g., elemental silicon, pure silicon). In additional embodiments, the target structure 126 is formed of and includes a different semiconductive material, such as one or more of silicon-germanium, germanium, gallium arsenide, gallium nitride, and indium phosphide. The target structure 126 and the substrate 128 may be provided into the internal chamber 122 of the PVD apparatus 104 by any desired means. In some embodiments, one or more conventional robotics apparatuses (e.g., robotic arms, robots) are employed to deliver the target structure 126 and the substrate 128 into the PVD apparatus 104.

After delivering the target structure 126 and the substrate 128 into the PVD apparatus 104, one or more feed fluid streams 150 (e.g., one or more gaseous fluid streams) may be introduced into the internal chamber 122 of the PVD apparatus 104 through one or more inlets 118 in the housing structure 112. The feed fluid stream(s) 150 may include one or more dopant precursor materials (e.g., n-type dopant precursors, p-type dopant precursors) from that dopant source 102, and one or more inert gases (e.g., one or more noble gases, such as one or more of Ar gas, He gas, Ne gas, Kr gas, and Xe gas) from the inert gas source 108. Optionally, the feed fluid stream(s) 150 may include one or more additional materials (e.g., carrier gases for the dopant precursor material(s)) as well. In some embodiments, the feed fluid stream(s) 150 include at least one n-type dopant precursor material (e.g., at least one P-containing material, at least one As-containing material, at least one Sb-containing material, at least one Bi-containing material), and at least one noble gas (e.g., Ar gas, He gas, Ne gas, Kr gas, Xe gas). In additional embodiments, the feed fluid stream(s) 150 include at least one P-type dopant precursor material (e.g., at least one B-containing material, at least one Al-containing material, at least one Ga-containing material), and at least one noble gas (e.g., Ar gas, He gas, Ne gas, Kr gas, Xe gas). The materials of the received feed fluid stream(s) 150 may stabilize the internal chamber 122 at a desired operating pressure of the PVD apparatus, such as an operating pressure within a range of from about 0.1 millitorr (mTorr) to about 300 mTorr (e.g., within a range of from about 0.1 mTorr to about 100 mTorr, from about 0.1 mTorr to about 50 mTorr, from about 1 mTorr to about 25 mTorr, from about 1 mTorr to about 15 mTorr, from about 3 mTorr to about 15 mTorr, or from about 5 mTorr to about 12 mTorr). The vacuum apparatus 146 (if any) of the material deposition system 100 may be employed to assist with maintaining the desired operating pressure within the internal chamber 122 by controlling the flow of one or more effluent fluid streams 152 (e.g., exhaust gas streams) from the internal chamber 122 of the PVD apparatus 104 through one or more outlets 120 in the housing structure 112.

Upon being received within the internal chamber 122 of the PVD apparatus 104, some precursor dopant material(s) of the feed fluid stream(s) 150 may interact (e.g., react) with the target structure 126. Such interaction may, for example, poison (e.g., contaminate) a surface of the target structure 126 with dopant elements (e.g., n-type dopant elements, such as P, As, Sb, and/or Bi; p-type dopant elements, such as B, Al, and/or Ga) of the precursor dopant material.

Next, one or more of the signal generators (e.g., one or more of the signal generator 127, the additional signal generator 134, and the further signal generator 144) may apply a voltage to one or more components of the PVD apparatus 104 (e.g., one or more of the target electrode 114, the substrate holder 116, and the coil structure 142) to produce a plasma within the internal chamber 122 of the PVD apparatus 104 from materials (e.g., inert gases, precursor dopant materials) of the feed fluid stream(s) 150. In some embodiments wherein the PVD apparatus 104 includes the magnet assembly 136, the magnet assembly 136 may be activated to produce a magnetic field around the target structure 126 and enhance properties (e.g., density) of the plasma. In addition, in some embodiments wherein the PVD apparatus 104 includes the coil structure 142, energy may be directed to the coil structure 142 from the further signal generator 144 to assist with creating, maintaining, and/or energizing plasma.

Ions (e.g., noble gas ions, dopant-containing ions) of the produced plasma interact (e.g., collide) with the target structure 126. Optionally, acceleration of some ions (e.g., noble gas ions, such as $Ar^+$, $He^+$, and/or $Ne^+$) toward the target structure 126 may be promoted by application of bias (e.g., negative bias) to the target electrode 114 by way of the signal generator 127. As ions of the plasma interact with target structure 126, at least some ions (e.g., at least some noble gas ions) may sputter (e.g., eject) material (e.g., atoms and/or molecules, such as one or more of Si atoms, Si-containing molecules, dopant atoms, and dopant-containing molecules) from the target structure 126. In some embodiments wherein the magnet assembly 136 is employed to produce a magnetic field around the target structure 126, the magnetic field may trap electrons to maintain charge neutrality in the plasma, enhance ion density in the plasma, and increase the removal uniformity and sputter rate of material from the target structure 126. In addition, in some embodiments wherein the coil structure 142 is employed to energize the plasma, at least a portion of the material sputtered from the target structure 126 may be ionized by the plasma.

As material sputtered from the target structure 126 passes through the plasma and toward the substrate 128, at least some neutral units (e.g., atoms, molecules) of the material and/or ions (e.g., silicon-containing ions, dopant-containing ions) formed from the material may react with one another, material (e.g., ions) of the plasma, and/or reactive materials (e.g., precursor dopant material) delivered into the PVD apparatus 104 before reaching the substrate 128. In addition embodiments, neutral units (e.g., atoms, molecules) of the material and/or ions (e.g., silicon-containing ions, dopant-containing ions) formed from the material pass through the plasma and toward the substrate 128 without substantially reacting with one another, material of the plasma, or reactive materials delivered into the PVD apparatus 104. For example, molecules of material formed during reactions between semiconductive material (e.g., silicon) of the target structure 126 and the precursor dopant material at the surface of the target structure 126 pass through the plasma and may be deposited on the substrate 128.

Upon passing through the plasma, sputtered materials (e.g., reacted sputtered materials, unreacted sputtered materials) may be deposited on, over, or within the substrate 128 to form a microelectronic device structure (e.g., a sputtered material structure, such as a sputtered material coating, a sputtered material film, a sputtered material layer). The microelectronic device structure may comprise material (e.g., silicon) of the target structure 126 doped with one or more dopant atoms (e.g., n-type dopant atoms, such as P atoms, As atoms, Sb atoms, Bi atoms; p-type dopant atoms, such as B atoms, Al atoms, Ga atoms) of the dopant precursor material from the dopant source 102. By way of non-limiting example, the microelectronic device structure may be formed of and include n-type silicon (N+Si) or p-type silicon (P+Si). As described in further detail below, depending on the operating conditions (e.g., material flow rate(s), applied bias(es), bias continuity, operating pressure(s)) employed during the formation of the microelectronic device structure, the microelectronic device structure may exhibit a substantially homogenous distribution of the elements thereof (e.g., such that the elements are substantially uniformly distributed throughout the microelectronic device structure), or heterogeneous distribution of one or more of the element thereof (e.g., such that the one or more elements are non-uniformly distributed throughout one or more dimensions of the microelectronic device structure).

The amount of precursor dopant material directed into the PVD apparatus 104 from the dopant source 102 may be controlled (e.g., maintained, adjusted) during use and operation of the material deposition system 100 to control the amount and distribution of dopant(s) within the microelectronic device structure formed on, over, or within the substrate 128. By way of non-limiting example, the ratio of dopant precursor material to inert gas included in the feed fluid stream(s) 150 may be controlled to control the amounts and distributions of dopant atoms within different regions (e.g., different vertical regions) of the formed microelectronic device structure. Increasing the ratio of precursor dopant material to inert gas entering into the PVD apparatus 104 by way of the feed fluid stream(s) 150 may increase the amount of dopant atoms provided within a particular region (e.g., a particular vertical region) of the microelectronic device structure as a result of the PVD apparatus 104 acting upon the feed fluid stream(s) 150. Likewise, decreasing the ratio of precursor dopant material to inert gas entering into the PVD apparatus 104 by way of the feed fluid stream(s) 150 may decrease the amount of dopant atoms provided within a particular region of the microelectronic device structure as a result of the PVD apparatus 104 acting upon the feed fluid stream(s) 150. Accordingly, adjusting the ratio of precursor dopant material to inert gas entering into within the PVD apparatus 104 by way of the feed fluid stream(s) 150 may facilitate the formation of a microelectronic device structure exhibiting a heterogeneous distribution of dopant (e.g., n-type dopant, p-type dopant) throughout a height (e.g., vertical dimension) thereof.

The operating pressure of the PVD apparatus 104 may also be controlled (e.g., maintained, adjusted) during use and operation of the material deposition system 100 to control characteristics of the microelectronic device structure formed on, over, or within the substrate 128. Increasing the operating pressure of the PVD apparatus 104 may increase the frequency of collisions between plasma ions (e.g., noble gas ions, dopant-containing ions) and neutral units (e.g., silicon atoms, silicon-containing molecules, dopant atoms, dopant-containing molecules) of material sputtered from the target structure 126, to increase the amount time that the sputtered material remains in (e.g., remains and reacts within) the plasma. As a result, a nearly isotropic directional distribution of material (e.g., reacted sputtered material, unreacted sputtered material) may be formed on, over, or within the substrate 128. Conversely, decreasing the operating pressure of the PVD apparatus 104 may decrease the frequency of collisions between plasma ions and neutral units of material sputtered from the target structure 126, to decrease the amount of time that the sputtered material remains in (e.g., remains and reacts within) the plasma. As a result, a relatively greater (as compared to the effects of relatively greater operating pressures) angular distribution of material may be formed on, over, or within the substrate 128.

Application (or lack thereof) of bias to one or more components (e.g., one or more of the target electrode 114, the substrate holder 116, and the coil structure 142) of the PVD apparatus 104 may also be used to control characteristics of the microelectronic device structure formed on, over, or within the substrate 128. For example, biasing the target electrode 114 may attract plasma ions (e.g., noble gas ions) to the target structure 126 to enhance collisions (and, hence, material ejection from) with the target structure 126. Similarly, biasing the substrate holder 116 may attract the ionized deposition materials (e.g., ionized sputtered materials, such as ionized, reacted sputtered materials and/or ionized, unreacted sputtered materials) to the substrate 128. Biasing the substrate holder 116 may attract the ionized deposition material toward the substrate 128 relatively more uniformly as compared to not biasing the substrate holder 116. Accordingly, bias may be applied to different components of the PVD apparatus 104 at different times. For example, during a first phase of the process, power may be supplied from the signal generator 127 to the target electrode 114 while the substrate holder 116 is left electrically neutral (e.g., no power is supplied from the additional signal generator 134 to the substrate holder 116); and during a second phase of the process, power may be supplied from the additional signal generator 134 to the substrate holder 116 while the target electrode 114 is left electrically neutral (e.g., no power is supplied from the signal generator 127 to the target electrode 114). As another example, during a first phase of the process, power may be supplied from the signal generator 127 to the target electrode 114 while the substrate holder 116 is left electrically neutral; and during a second phase of the process, the target electrode 114 and the substrate holder 116 may both be left electrically neutral. As a further example, during a first phase of the process, power may be supplied from the signal generator 127 to the target electrode 114 while the substrate holder 116 is left electrically neutral; during a second phase of the process, the target electrode 114 and the substrate holder 116 may both be left electrically neutral; and during a third phase of the process, power may be supplied from the additional signal generator 134 to the substrate holder 116 while the target electrode 114 is left electrically neutral.

The continuity (or discontinuity) of bias applied to a given component of the (e.g., the target electrode 114, the substrate holder 116, and the coil structure 142) of the PVD apparatus 104 over a given period of time may also be used to control characteristics of the microelectronic device structure formed on, over, or within the substrate 128. Pulsed signals (e.g., a pulsed RF (PRF) signal, a pulsed DC (PDC) signal) may be employed to bias different components of the PVD apparatus 104, and/or non-pulsed signals (e.g., continuous signals, such as a continuous RF signal, a continuous DC signal) employed to bias different components of the PVD apparatus 104. In some embodiments, pulsed signals including bursts of current (e.g., RF current, DC) are employed to bias one or more components of the PVD apparatus 104. Pulsing the applied current may, for example, facilitate heat dissipation during the silent period. If pulsed signals are employed, the duty cycle (ti/Ti, wherein ti is the pulse width and Ti is the frequency at which the signal is pulsed or modulated) of the applied bias waveform may be controlled to facilitate desirable characteristics in the microelectronic device structure formed on, over, or within the substrate 128. For example, increasing the duty cycle of a bias waveform applied to one or more of the substrate holder 116 and the target electrode 114 may reduce (or even eliminate) undesirable impurities (e.g., hydrogen impurities) and/or void spaces (e.g., resulting from at least some of the impurities, such as hydrogen impurities, following anneal) within the microelectronic device structure.

Additional operating parameters of the PVD apparatus 104 may also be controlled (e.g., maintained, adjusted) to control characteristics of the microelectronic device structure formed on, over, or within the substrate 128. Non-limiting examples of such additional operational parameters include the operational temperature of the PVD apparatus 104 and the rotational speed of the magnet assembly 136 (if any) of the PVD apparatus 104. In some embodiments, the operational temperature of the PVD apparatus 104 is controlled to be less than or equal to about 500° C., such as within a range of from about −20° C. to about 500° C., from about 100° C. to about 400° C., or from about 200° C. to about 400° C. The operational temperature of the PVD apparatus 104 may be significantly lower than operational temperatures required by many conventional material deposition apparatuses and processes (e.g., conventional CVD apparatuses and processes) employed to form a microelectronic device structure on, over, or within a substrate.

During and/or after the formation of the microelectronic device structure on, over, or within the substrate 128 exhaust gases including unreacted materials (e.g., precursor dopant materials, noble gases, noble gas ions, dopant atoms, dopant-containing molecules, dopant-containing ions, Si atoms, Si-containing molecules, Si-containing ions, carrier gases) and/or reaction byproducts may exit the PVD apparatus 104 through one or more outlets 120 in the housing structure 112 thereof as at least one effluent fluid stream 152. The effluent fluid stream 152 may then be further treated (e.g., scrubbed using the effluent fluid treatment apparatus 148 (if any)), utilized (e.g., recycled, recirculated), and/or disposed of, as desired.

Thus, in accordance with embodiments of the disclosure, a method of forming a microelectronic device comprises directing at least one feed fluid stream into a physical vapor deposition apparatus containing a semiconductive target structure. The at least one feed fluid stream comprises at least one dopant precursor material and at least one noble gas. A plasma is formed within the physical vapor deposition apparatus using the at least one feed fluid stream. Material is sputtered from the semiconductive target structure using the plasma.

Figure 2:
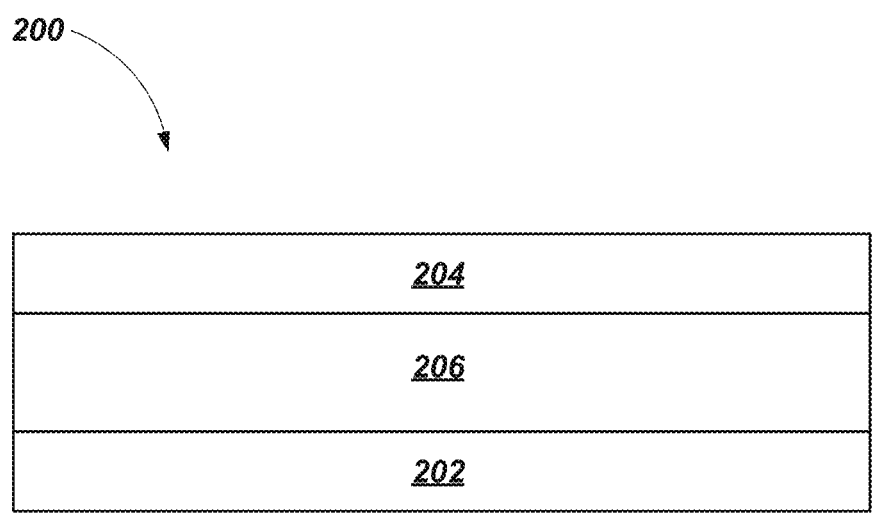
FIG. 2 is a simplified partial cross-sectional view of a microelectronic device structure formed using the material deposition system shown in FIG. 1, in accordance with embodiments of the disclosure.

FIG. 2 illustrates a simplified, partial cross-sectional view of a microelectronic device structure 200 that may formed using the material deposition system 100 and the methods previously described with reference to FIG. 1, in accordance with embodiments of the disclosure. The microelectronic device structure 200 may, for example, correspond to the microelectronic device structure formed on, over, or within the substrate 128 using the material deposition system 100 and the methods previously described with reference to FIG. 1. As shown in FIG. 2, the microelectronic device structure 200 may be formed to include a first region 202, a second region 204, and a third region 206 interposed between the first region 202 and the second region 204. The first region 202 and the second region 204 may include relatively greater amounts of dopant (e.g., n-type dopant, p-type dopant) than the third region 206. The first region 202 and the second region 204 may, for example, be employed as contact regions (e.g., a source region and a drain region) of a microelectronic device including the microelectronic device structure 200; and the third region 206 may, for example, be employed as a channel region of the microelectronic device.

The first region 202 and the second region 204 of the microelectronic device structure 200 may each individually comprise a semiconductive material doped with at least one dopant. For example, the first region 202 and the second region 204 may each individually comprise Si doped with at least one n-type dopant (e.g., one or more of P, As, An, and Bi) or at least one p-type dopant (e.g., one or more of B, Al, and Ga). In some embodiments, the first region 202 and the second region 204 each comprise Si doped with at least one n-type dopant, such that the first region 202 and the second region 204 each exhibit an excess of free electrons. In additional embodiments, the first region 202 and the second region 204 each comprise Si doped with at least one p-type dopant, such that the first region 202 and the second region 204 each exhibit a deficiency of valence electrons (commonly referred to as "holes"). At least a portion of each of the first region 202 and the second region 204 may be relatively heavily doped with dopant. For example, at least a portion of the first region 202 and at least a portion of the second region 204 may comprise $N^+$ Si; or at least a portion of the first region 202 and at least a portion of the second region 204 may comprise $P^+$ Si. The first region 202 and the second region 204 may each individually be formed to be substantially free of void spaces and/or materials other than the semiconductive material and the dopant(s). For example, the first region 202 and the second region 204 may each individually be formed to be substantially free of void spaces and hydrogen impurities.

The methods of the disclosure previously described with reference to FIG. 1 may advantageously facilitate the forming the first region 202 and the second region 204 of the microelectronic device structure 200 to individually have greater amounts of dopant(s) than conventional contact regions (e.g., conventional $N^+$ Si contact regions, conventional $P^+$ Si contact regions) formed by conventional CVD processes or conventional PVD processes. For example, conventional PVD processes employing sputtering from a conventional $N^+$ Si target or a conventional $P^+$ Si target may lack sufficient amounts of n-type dopant(s) or p-type dopant(s) in the conventional $N^+$ Si target or the conventional $P^+$ Si target to facilitate the amounts (e.g., concentrations) of dopant(s) present within the first region 202 and the second region 204. Furthermore, significant amounts of dopant(s) may be lost conventional PVD processes that may otherwise preclude the amounts of dopant(s) present within the first region 202 and the second region 204. In addition, conventional CVD processes may be unable to achieve the amount of dopant(s) present within the first region 202 and the second region 204 without thermally damaging (e.g., due to relatively higher temperatures associated with CVD processes) other components of a microelectronic device including the microelectronic device structure 200. By way of non-limiting example, the first region 202 and the second region 204 of the microelectronic device structure 200 may be formed to exhibit amounts of the dopant(s) up to the upper solid solubility limit(s) of the dopant(s) in the semiconductive material of the first region 202 and the second region 204. In some embodiments, at least partially depending on the properties of the dopant(s) and desired electrical properties of the microelectronic device structure 200, the first region 202 and the second region 204 may each individually include from about $1.4 \times 10^{15}$ dopant atoms cubic centimeter ($cm^3$) to about $1.5 \times 10^{22}$ dopant atoms/$cm^3$. As a non-limiting example, if the first region 202 and the second region 204 each comprise As-doped Si, the first region 202 and the second region 204 may each individually include up to about $1.4 \times 10^{21}$ As atoms/$cm^3$, such as from about $1 \times 10^{20}$ As atoms/$cm^3$ to about $1.4 \times 10^{21}$ As atoms/$cm^3$. As another non-limiting example, if the first region 202 and the second region 204 comprise P-doped Si, the first region 202 and the second region 204 may each individually include up to about $1.2 \times 10^{21}$ P atoms/$cm^3$, such as from about $1.0 \times 10^{20}$ P atoms/$cm^3$ to about $1.2 \times 10^{21}$ P atoms/$cm^3$.

In some embodiments, the first region 202 and the second region 204 of the microelectronic device structure 200 are each individually formed to exhibit a substantially homogenous distribution of the dopant(s)(e.g., n-type dopant(s), p-type dopant(s)) thereof, such that the dopant(s) of the first region 202 and the second region 204 are substantially uniformly distributed throughout the first region 202 and the second region 204. In additional embodiments, at least one of the first region 202 and the second region 204 of the microelectronic device structure 200 is/are formed to exhibit a heterogeneous distribution of dopant(s) thereof, such that the dopant(s) of the first region 202 and/or the second region 204 are non-uniformly distributed throughout the first region 202 and/or the second region 204. For example, the first region 202 and the second region 204 may each exhibit a heterogeneous distribution of the dopant(s) thereof. In such embodiments, amounts of the dopant(s) may vary throughout dimensions (e.g., heights) of the first region 202 and/or the second region 204. As a non-limiting example, amounts of the dopant(s) in the first region 202 and/or the second region 204 may increase in a direction extending away from the third region 206 of the microelectronic device structure 200. As another non-limiting example, amounts of the dopant(s) in the first region 202 and/or the second region 204 may decrease in a direction extending away from the third region 206 of the microelectronic device structure 200. If the first region 202 and/or the second region 204 exhibit a heterogeneous distribution of dopant(s) thereof, amounts of the dopant(s) may vary stepwise (e.g., change abruptly), or may vary continuously (e.g., change progressively, such as linearly or parabolically) throughout the dimensions (e.g., height) of the first region 202 and/or the second region 204.

The first region 202 and the second region 204 of the microelectronic device structure 200 may be substantially similar to one another (e.g., may exhibit substantially the same dimensions, substantially the same material composition, and substantially the same material distribution extending away from the third region 206), or may be at least partially different than one another (e.g., may exhibit one or more of at least one different dimension, different material compositions, and different material distributions extending away from the third region 206). In some embodiments, the first region 202 and the second region 204 have substantially the same geometric configurations (e.g., dimensions, shape) as one another, substantially the same material compositions as one another, and substantially the same material distributions as one another in directions extending away from the third region 206. Put another way, the first region 202 and the second region 204 of the microelectronic device structure 200 substantially mirror one another about the third region 206.

The third region 206 of the microelectronic device structure 200 may comprise a substantially undoped semiconductive material, or a semiconductive material doped with at least one dopant having an opposite conductive type than a dopant of the first region 202 and the second region 204. The semiconductive material of the third region 206 may be substantially the same as the semiconductive material of the first region 202 and the second region 204. In some embodiments, the third region 206 comprises substantially undoped Si. In additional embodiments, such as embodiments wherein the first region 202 and the second region 204 comprise n-type Si (e.g., N$^+$ Si), the third region 206 comprises p-type Si. In further embodiments, such as embodiments wherein the first region 202 and the second region 204 comprise p-type Si (e.g., P$^+$ Si), the third region 206 comprises n-type Si. The third region 206 may be formed to be substantially free of void spaces and/or materials other than the semiconductive material and the dopant(s)(if any). For example, the third region 206 may be formed to be substantially free of void spaces and hydrogen impurities. In addition, the third region 206 may be formed to be substantially homogeneous (such that the third region 206 exhibits a substantially uniform distribution of the element(s) thereof), or may be formed to be heterogeneous (such that the third region 206 exhibits a non-uniform distribution of one or more of the element(s) thereof). In some embodiments, the third region 206 exhibits a substantially homogeneous distribution of the element(s) thereof.

Thus, in accordance with embodiments of the disclosure, a microelectronic device comprises a microelectronic device structure substantially free of void spaces therein. The microelectronic device structure comprises two regions and an additional region intervening between the two regions. Each of the two regions individually comprises a semiconductive material doped with an n-type dopant. At least a portion of each of the two regions comprises from about $1.4 \times 10^{15}$ atoms of the n-type dopant per cubic centimeter thereof to about $1.5 \times 10^{22}$ atoms of the n-type dopant per cubic centimeter thereof. The additional region comprises the semiconductive material substantially undoped with the n-type dopant.

Figure 3:
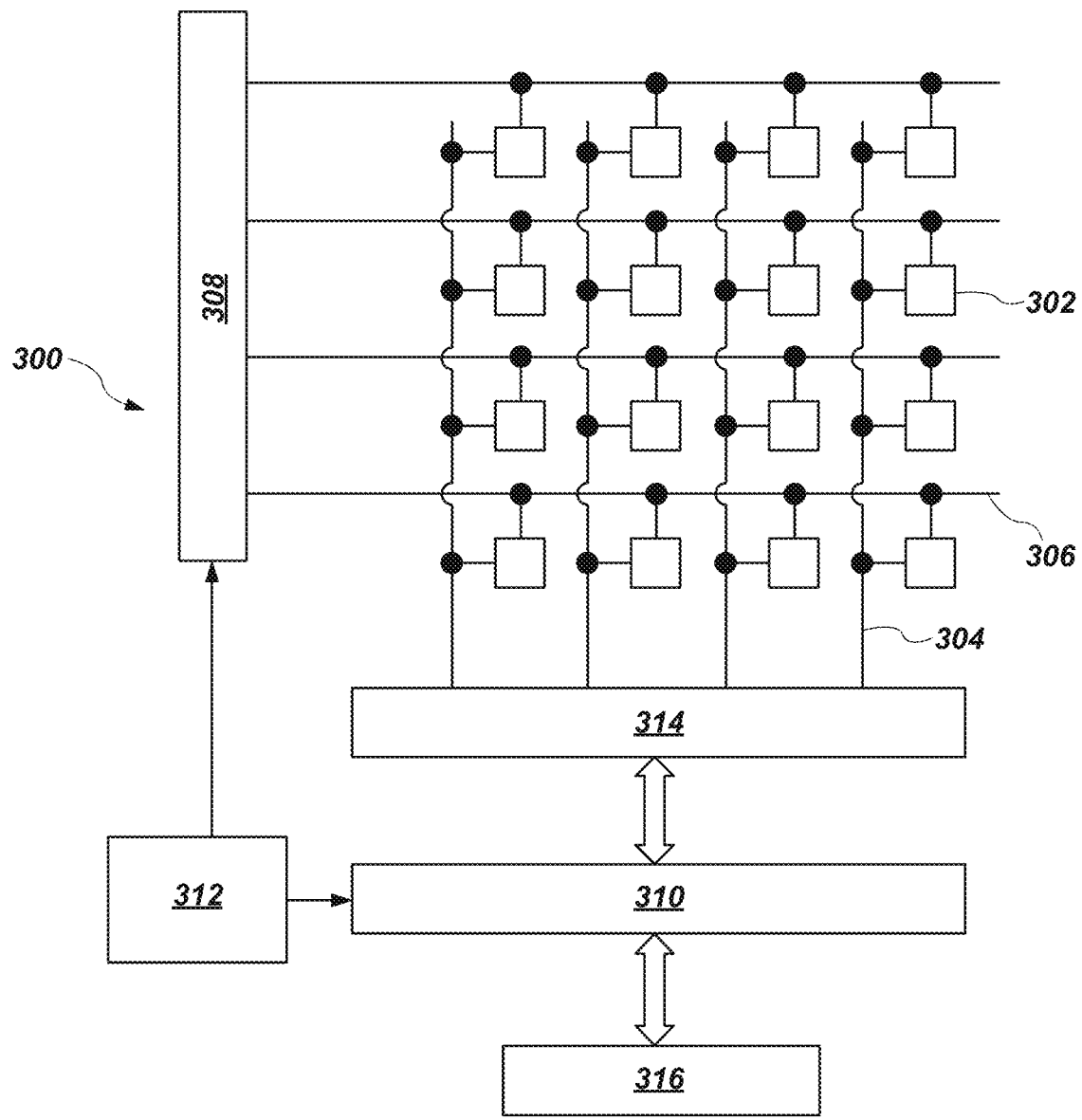
FIG. 3 is a functional block diagram of a memory device, in accordance with an embodiment of the disclosure.

Microelectronic device structures of the disclosure (e.g., the microelectronic device structure 200 shown in FIG. 2) formed using the systems (e.g., the material deposition system 100 shown in FIG. 1) and methods of the disclosure may be employed in microelectronic devices (e.g., memory devices) of the disclosure. As a non-limiting example, FIG. 3 illustrates a functional block diagram of a memory device 300, in accordance with an embodiment of the disclosure. The memory device 300 may include, for example, an embodiment of the microelectronic device structure 200 previously described herein with reference to FIG. 2. As shown in FIG. 3, the memory device 300 may include memory cells 302, digit lines 304, word lines 306, a row decoder 308, a column decoder 310, a memory controller 312, a sense device 314, and an input/output device 316.

The memory cells 302 of the memory device 300 are programmable to at least two different logic states (e.g., logic 0 and logic 1). Each memory cell 302 may individually include a capacitor and transistor. The capacitor stores a charge representative of the programmable logic state (e.g., a charged capacitor may represent a first logic state, such as a logic 1; and an uncharged capacitor may represent a second logic state, such as a logic 0) of the memory cell 302. The transistor grants access to the capacitor upon application (e.g., by way of one of the word lines 306) of a minimum threshold voltage to a channel region thereof for operations (e.g., reading, writing, rewriting) on the capacitor. At least one (e.g., each) of the transistors of the memory cells 302 may include, for example, an embodiment of the microelectronic device structure 200 previously described herein with reference FIG. 2. For example, the first region 202 (FIG. 2) and the second region 204 (FIG. 2) of the microelectronic device structure 200 (FIG. 2) may be employed as a source region and a drain region of the transistor, and the third region 206 (FIG. 2) of the microelectronic device structure 200 may be employed as a channel region of the transistor. In addition, the transistor may further include at least one gate operatively associated with the channel region thereof.

The memory cells 302 may be arranged in memory arrays. The memory arrays may be two-dimensional (2D) so as to exhibit a single deck (e.g., a single tier, a single level) of the memory cells 302, or may be three-dimensional (3D) so as to exhibit multiple decks (e.g., multiple levels, multiple tiers) of the memory cells 302. Each deck of the memory cells 302 may individually include columns of the memory cells 302 extending in a first horizontal direction, and rows of the memory cells 302 extending in a second horizontal direction orthogonal to the first horizontal direction. In some embodiments, the memory device 300 exhibits a 3D architecture including a 3D memory array of the memory cells 302. As previously discussed above, the systems (e.g., the material deposition system 100 previously described with reference to FIG. 1) and methods of the disclosure may facilitate the formation of the microelectronic device structure 200 (FIG. 2) (including the first region 202, the second region 204, and the third region 206 thereof) for individual transistors of memory cells 302 of the 3D memory array without the problems (e.g., thermal damage to other components of the memory device; relatively lower dopant concentration capabilities and/or dopant distribution capabilities; relatively higher amounts of impurities and/or formed void spaces) of conventional systems and methods (e.g., conventional CVD systems and methods, conventional PVD systems and methods).

With continued reference to FIG. 3, the digit lines 304 are connected to the capacitors of the memory cells 302 by way of the transistors of the memory cells 302. The word lines 306 extend perpendicular to the digit lines 304, and are connected to the gates of the transistors of the memory cells 302. Operations may be performed on the memory cells 302 by activating appropriate digit lines 304 and word lines 306. Activating a digit line 304 or a word line 306 may include applying a voltage potential to the digit line 304 or the word line 306. Each column of memory cells 302 may individually be connected to one of the digit lines 304, and each row of the memory cells 302 may individually be connected to one of the word lines 306. Individual memory cells 302 may be addressed and accessed through the intersections (e.g., cross points) of the digit lines 304 and the word lines 306.

The memory controller 312 may control the operations of memory cells 302 through various components, including the row decoder 308, the column decoder 310, and the sense device 314 (e.g., local I/O device). The memory controller 312 may generate row address signals that are directed to the row decoder 308 to activate (e.g., apply a voltage potential to) predetermined word lines 306, and may generate column address signals that are directed to the column decoder 310 to activate (e.g., apply a voltage potential to) predetermined digit lines 304. The sense device 314 may include sense amplifiers configured and operated to receive digit line inputs from the digit lines selected by the column decoder 310 and to generate digital data values during read operations. The sense device 314 may include, for example, an embodiment of the microelectronic device structure 200 previously described herein with reference to FIG. 2. The memory controller 312 may also generate and control various voltage potentials employed during the operation of the memory device 300. In general, the amplitude, shape, and/or duration of an applied voltage may be adjusted (e.g., varied), and may be different for various operations of the memory device 300.

During use and operation of the memory device 300, after being accessed, a memory cell 302 may be read (e.g., sensed) by the sense device 314. The sense device 314 may compare a signal (e.g., a voltage) of an appropriate digit line 304 to a reference signal in order to determine the logic state of the memory cell 302. If, for example, the digit line 304 has a higher voltage than the reference voltage, the sense device 314 may determine that the stored logic state of the memory cell 302 is a logic 1, and vice versa. The sense device 314 may include transistors and amplifiers to detect and amplify a difference in the signals (commonly referred to in the art as "latching"). The detected logic state of a memory cell 302 may be output through the column decoder 310 to the input/output device 316. In addition, a memory cell 302 may be set (e.g., written) by similarly activating an appropriate word line 306 and an appropriate digit line 304 of the memory device 300. By controlling the digit line 304 while the word line 306 is activated, the memory cell 302 may be set (e.g., a logic value may be stored in the memory cell 302). The column decoder 310 may accept data from the input/output device 316 to be written to the memory cells 302. Furthermore, a memory cell 302 may also be refreshed (e.g., recharged) by reading the memory cell 302. The read operation will place the contents of the memory cell 302 on the appropriate digit line 304, which is then pulled up to full level (e.g., full charge or discharge) by the sense device 314. When the word line 306 associated with the memory cell 302 is deactivated, all of memory cells 302 in the row associated with the word line 306 are restored to full charge or discharge.

Thus, in accordance with embodiments of the disclosure, a memory device comprises a memory array comprising at least one deck of memory cells operably coupled to digit lines and word lines. At least one of the memory cells comprises a transistor comprising contact regions each comprising N+ Si including from about $1.4\times10^{15}$ n-type atoms/cm$^3$ to about $1.5\times10^{22}$ n-type atoms/cm$^3$, and a channel region between the contact regions and comprising undoped Si.

Figure 4:
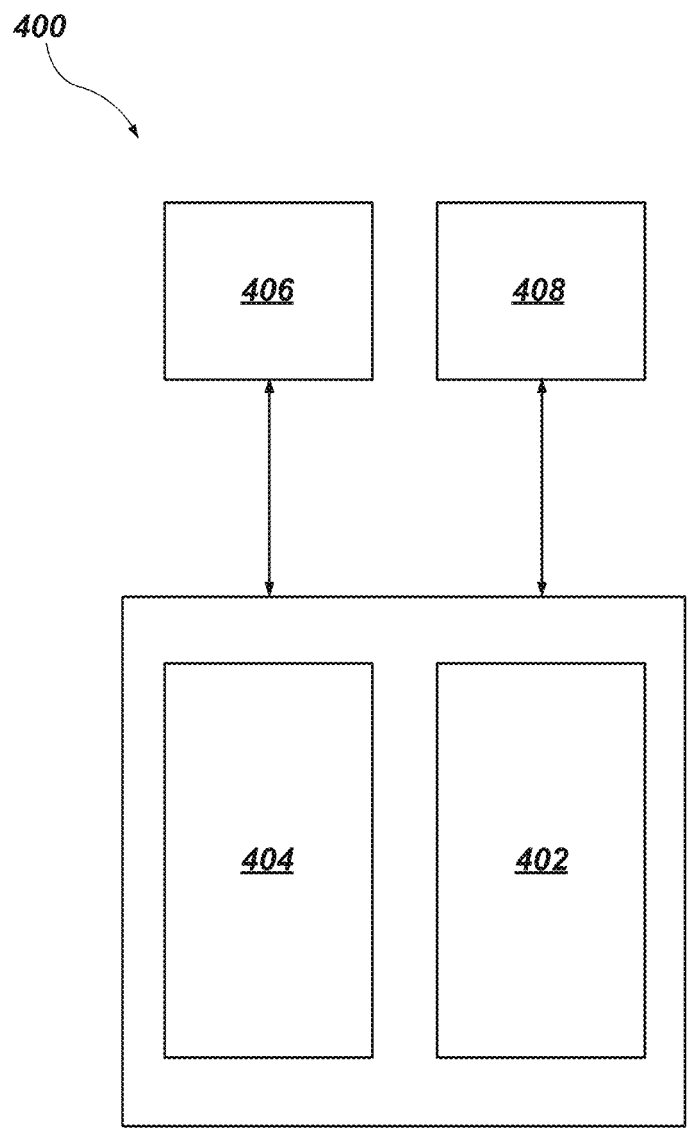
FIG. 4 is a schematic block diagram of an electronic system, in accordance with an embodiment of the disclosure.

Microelectronic device structures (e.g., the microelectronic device structure 200 previously described with reference to FIG. 2) and microelectronic devices (e.g., the memory device 300 previously described with reference to FIG. 3) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure and a microelectronic device previously described herein. The electronic system 400 may further include at least one electronic signal processor device 404 (often referred to as a "microprocessor"). The electronic signal processor device 404 may, optionally, include an embodiment of one or more of a microelectronic device structure and a microelectronic device previously described herein. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure and a microelectronic device previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises at least one memory cell comprising a transistor comprising a source region, a drain region, and a channel region between the source region and the drain region. The source region comprises doped silicon substantially free of void spaces therein. The doped silicon has a heterogeneous distribution of dopant varying continuously throughout a dimension of the source region. The drain region comprises additional doped silicon substantially free of void spaces therein. The additional doped silicon has an additional heterogeneous distribution of dopant varying continuously throughout a dimension of the drain region and substantially mirroring the heterogeneous distribution of dopant of the source region. The channel region comprises undoped silicon.

The material deposition systems (e.g., the material deposition system 100 (FIG. 1)), methods, microelectronic device structures (e.g., the microelectronic device structure (FIG. 2)), microelectronic devices (e.g., the memory device 300 (FIG. 3)), and electronic systems (e.g., the electronic system 400 (FIG. 4)) of the disclosure facilitate reduced costs (e.g., manufacturing costs, material costs), increased miniaturization of components, improved performance, and greater packaging density as compared to conventional material deposition systems, conventional methods, conventional microelectronic device structures, conventional microelectronic devices, and conventional electronic systems. The material deposition systems, methods, microelectronic device structures, microelectronic devices, and electronic systems of the disclosure may improve scalability, efficiency, and simplicity as compared to conventional material deposition systems, conventional methods, conventional microelectronic device structures, conventional microelectronic devices, and conventional electronic systems.

The following examples serve to explain embodiments of the disclosure in more detail. These examples are not to be construed as being exhaustive, exclusive, or otherwise limiting as to the scope of the disclosure.

EXAMPLES

Example 1: Duty Cycle Analysis

The effect of duty cycle (ti/Ti, wherein ti is the pulse width and Ti is the frequency at which the signal is pulsed or modulated) on the formation of hydrogen impurities and associated post-anneal void spaces within a microelectronic device structure formed using the material deposition systems and methods of the disclosure was analyzed. A feed fluid stream in accordance with an embodiment of the disclosure was delivered into a PVD apparatus including a Si target structure adjacent a target electrode connected to a pulsed DC signal generator. The power supplied to the target electrode from the pulsed DC signal generator was selected to be 1 kilowatt (KW) and the operational pressure of the PVD apparatus was maintained at 3 mTorr.

Figure 5B:
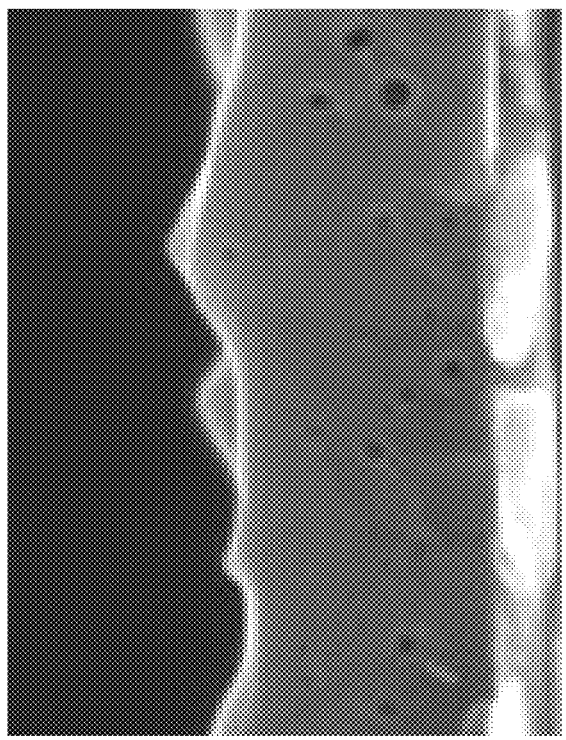
FIGS. 5A and 5B are scanning electronic microscopy (SEM) images of different microelectronic device structures formed using different duty cycles and frequencies than one another, as described in Example 1.
Figure 5A:
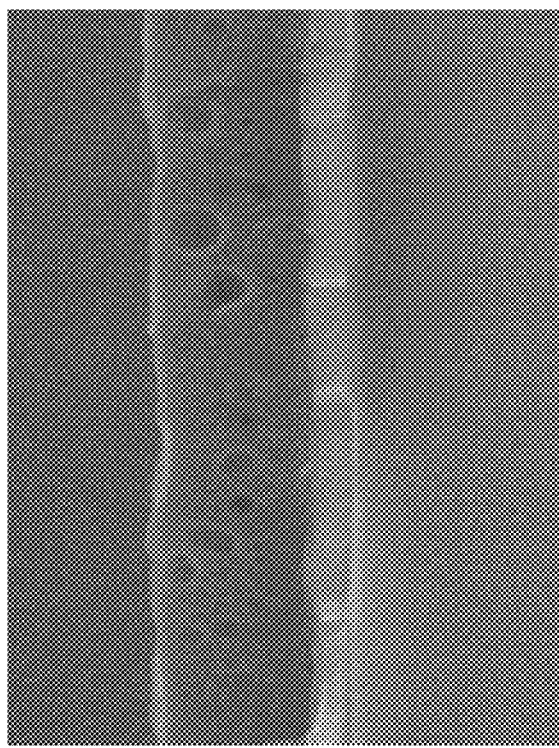

FIG. 5A is a scanning electron micrograph (SEM) image showing the effects of a relatively lower duty cycle employing a relatively higher frequency on the formation of gaseous impurities and associated post-anneal void spaces within a microelectronic device structure formed from sputtering the Si target structure. FIG. 5B is a SEM image showing the effects of a relatively higher duty cycle employing a relatively lower frequency on the formation of gaseous impurities and associated post-anneal void spaces within a microelectronic device structure formed from sputtering the Si target structure.

As shown by the comparison of FIGS. 5A and 5B, the relatively higher duty cycle employing the relatively lower frequency reduced the formation of gaseous impurities and associated post-anneal void spaces.

Example 2: Supplied Power and Operational Pressure Analysis

The effects of supplied power and operational pressure on the formation of hydrogen impurities and associated post-anneal void spaces within a microelectronic device structure formed using the material deposition systems and methods of the disclosure were analyzed. A feed fluid stream in accordance with an embodiment of the disclosure was delivered into a PVD apparatus including a Si target structure adjacent a target electrode connected to a signal generator. Combinations of different power levels (4 KW, 6 KW) supplied to the target electrode and different operational pressures (3 mTorr, 6 mTorr to 10 mTorr) of the PVD apparatus were employed to form different microelectronic device structures for evaluation.

Figure 6A:
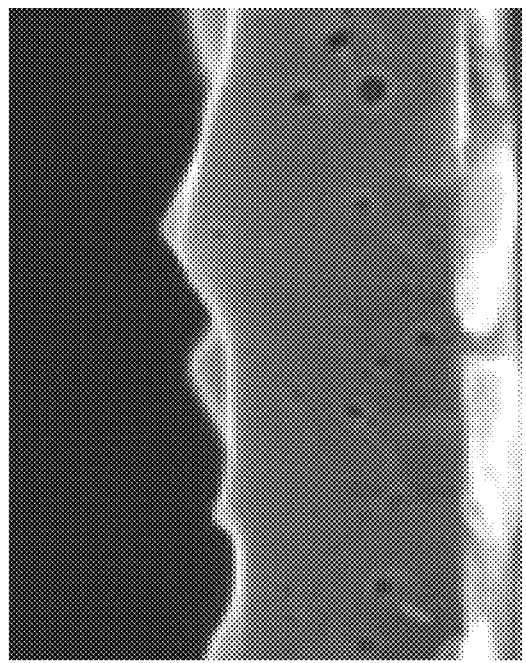
FIGS. 6A through 6D are SEM images of different microelectronic device structures formed using different supplied power levels and PVD apparatus operational pressures than one another, as described in Example 2.
Figure 6B:
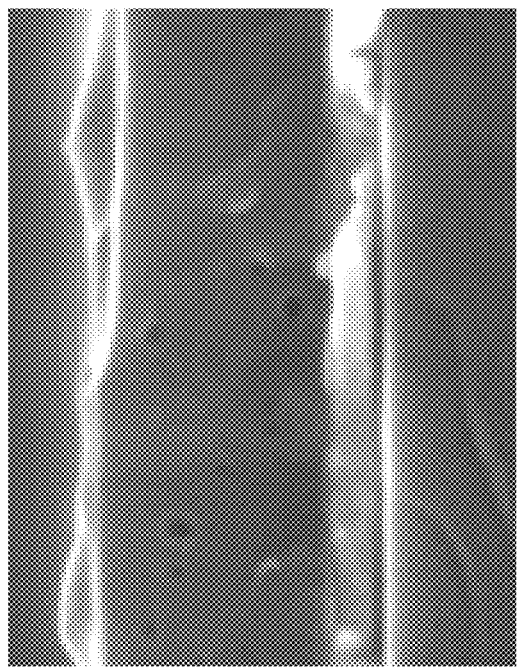
Figure 6D:
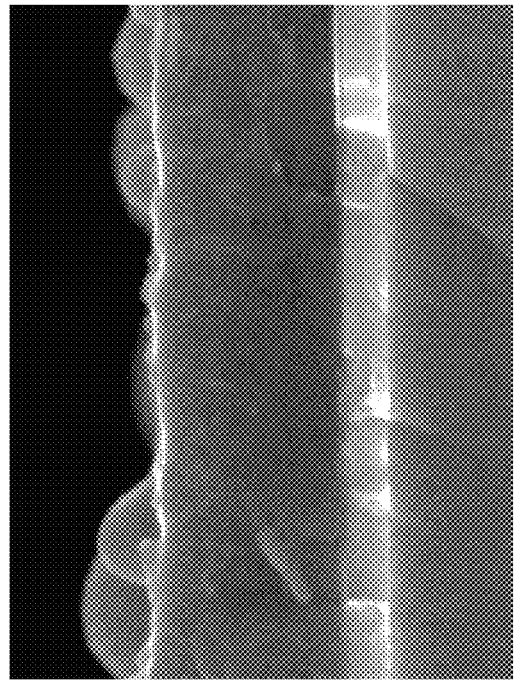
Figure 6C:
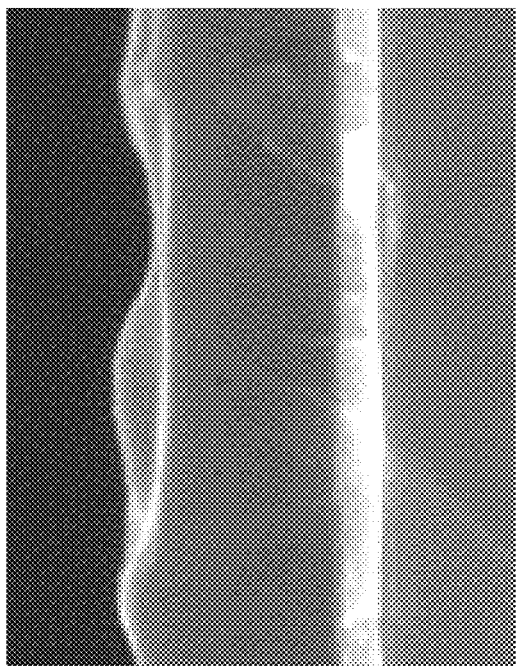

FIG. 6A is a SEM image showing the effects of 4 KW supplied power and 3 mTorr operational pressure on the formation of gaseous impurities and associated post-anneal void spaces within a microelectronic device structure formed from sputtering the Si target structure. FIG. 6B is a SEM image showing the effects of 6 KW supplied power and 3 mTorr operational pressure on the formation of gaseous impurities and associated post-anneal void spaces within a microelectronic device structure formed from sputtering the Si target structure. FIG. 6C is a SEM image showing the effects of 6 KW supplied power and 6 mTorr operational pressure on the formation of gaseous impurities and associated post-anneal void spaces within a microelectronic device structure formed from sputtering the Si target structure. FIG. 6D is a SEM image showing the effects of 6 KW supplied power and 10 mTorr operational pressure on the formation of gaseous impurities and associated post-anneal void spaces within a microelectronic device structure formed from sputtering the Si target structure.

As shown by the comparison of FIGS. 6A through 6D, increasing the power supplied (within optimal zone) to the target electrode and the operational pressure (within optimal zone) of the PVD apparatus reduced the formation of gaseous impurities and associated post-anneal void spaces.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:
1. A material deposition system, comprising:
   a dopant source containing at least one dopant precursor material;
   an inert gas source containing at least one noble gas;
   an injector apparatus including an atomizing nozzle downstream of each of the dopant source and the inert gas source, the injector apparatus configured to receive the at least one dopant precursor material from the dopant source and the at least one noble gas from the inert gas source and to combine the at least one dopant precursor material and the at least one noble gas to form at least one feed fluid stream; and
   a physical vapor deposition apparatus downstream of the injector apparatus and comprising:
      a housing structure configured and positioned to receive the at least one feed fluid stream from the injector apparatus;
      a target electrode within the housing structure and in electrical communication with a signal generator;
      a magnet assembly within the housing structure and above the target electrode, the magnet assembly comprising:
         a rotatable platform connected to an external drive motor; and magnets interposed between the rotatable platform and the target electrode; and a substrate holder within the housing structure and spaced apart from the target electrode.

2. The material deposition system of claim 1, wherein the at least one dopant precursor material comprises one or more of a phosphorus-containing material, an arsenic-containing material, an antimony-containing material, and a bismuth-containing material.

3. The material deposition system of claim 1, wherein the at least one dopant precursor material comprises one or more of a boron-containing material, an aluminum-containing material, and an antimony-containing material, and a gallium-containing material.

4. The material deposition system of claim 1, wherein the at least one dopant precursor material comprises one or more of a liquid dopant precursor material and a flowable solid dopant precursor material.

5. The material deposition system of claim 1, wherein the at least one noble gas comprises one or more of argon gas, helium gas, and neon gas.

6. The material deposition system of claim 1, further comprising a heating apparatus configured and positioned to heat the at least one dopant precursor material of the dopant source.

7. The material deposition system of claim 1, wherein the substrate holder of the physical vapor deposition apparatus is in electrical communication with an additional signal generator.

8. The material deposition system of claim 1, wherein the physical vapor deposition apparatus further comprises a coil structure within the housing structure and between the target electrode and the substrate holder, the coil structure in electrical communication with another signal generator.

9. The material deposition system of claim 1, further comprising at least one scrubber apparatus configured and positioned to remove one or more materials from at least one exhaust gas stream exiting the housing structure of the physical vapor deposition apparatus.

10. The material deposition system of claim 1, wherein the dopant source is configured to contain a powder comprising solid particles of the at least one dopant precursor material.

11. A method of forming a microelectronic device, comprising:
combining at least one dopant precursor material received from a dopant source with at least one noble gas received from an inert gas source within an injector apparatus including an atomizing nozzle downstream of each of the dopant source and the inert gas source to form at least one feed fluid stream;
directing the at least one feed fluid stream into a physical vapor deposition apparatus comprising:
a housing structure configured and positioned to receive the at least one feed fluid stream;
a target electrode within the housing structure and in electrical communication with a signal generator;
a magnet assembly within the housing structure and above the target electrode, the magnet assembly comprising:
a rotatable platform connected to an external drive motor; and
magnets interposed between the rotatable platform and the target electrode; and
a substrate holder within the housing structure and spaced apart from the target electrode;
forming a plasma within the physical vapor deposition apparatus using the at least one feed fluid stream; and
sputtering material from a semiconductive target structure using the plasma.

12. The method of claim 11, further comprising selecting the semiconductive target structure from the group consisting of silicon, silicon-germanium, germanium, gallium arsenide, gallium nitride, and indium phosphide.

13. The method of claim 11, further comprising:
selecting the at least one dopant precursor material to comprise one or more of a phosphorus-containing material, an arsenic-containing material, an antimony-containing material, and a bismuth-containing material; and
selecting the at least one noble gas to comprise one or more of argon gas, helium gas, and neon gas.

14. The method of claim 11, wherein directing at least one feed fluid stream into a PVD apparatus comprising contaminating a surface of the semiconductive target structure with dopant elements of the at least one dopant precursor material.

15. The method of claim 14, wherein sputtering material from the semiconductive target structure using the plasma comprises ejecting one or more of silicon ions, silicon atoms, silicon-containing molecules, dopant ions, dopant atoms, and dopant-containing molecules from the semiconductive target structure using noble gas ions of the plasma formed from the at least one noble gas of the at least one feed fluid stream.

16. The method of claim 11, wherein forming a plasma within the physical vapor deposition apparatus comprises applying a voltage to one or more of a target electrode adjacent the semiconductive target structure, a substrate holder offset from the target electrode, and a coil structure between the target electrode and the substrate holder to form the plasma from components of the at least one feed fluid stream.

17. The method of claim 11, further comprising ionizing at least a portion of the material sputtered from the semiconductive target structure.

18. The method of claim 11, further comprising reacting at least some of the material sputtered from the semiconductive target structure with at least one other material as the material passes through the plasma toward a substrate holder of the physical vapor deposition apparatus.

19. The method of claim 18, wherein reacting at least some of the material sputtered from the semiconductive target structure with at least one other material comprises reacting one or more of silicon atoms and silicon-containing molecules with one or more of dopant-atoms and dopant-containing molecules.

20. The method of claim 11, further comprising forming a microelectronic device structure from the material sputtered from the semiconductive target structure, the microelectronic device structure comprising semiconductive material of the semiconductive target structure and at least one dopant element of the dopant precursor material heterogeneously dispersed within semiconductive material.

* * * * *

UNITED STATES PATENT AND TRADEMARK OFFICE
CERTIFICATE OF CORRECTION

PATENT NO. : 11,515,147 B2
APPLICATION NO. : 16/708141
DATED : November 29, 2022
INVENTOR(S) : Clement Jacob, Richard L. Elliott and Christopher W. Petz It is certified that error appears in the above-identified patent and that said Letters Patent is hereby corrected as shown below:

In the Specification

| | | |
|---|---|---|
| Column 2, | Line 13, | change "having ditferent" to --having different-- |
| Column 14, | Lines 20-21, | change "(ti/Ti, wherein ti is the pulse width and Ti is" to --($t_1/T_1$, wherein $t_1$ is the pulse width and $T_1$ is-- |
| Column 17, | Line 36, | change "dopant(s)(if any)." to --dopant(s) (if any).-- |
| Column 21, | Lines 29-30, | change "(ti/Ti, wherein ti is the pulse width and Ti is" to --($t_1/T_1$, wherein $t_1$ is the pulse width and $T_1$ is-- |

In the Claims

| | | | |
|---|---|---|---|
| Claim 14, | Column 24, | Line 21, | change "apparatus comprising" to --apparatus comprises-- |
| Claim 18, | Column 24, | Line 47, | change "toward a substrate" to --toward the substrate-- |

Signed and Sealed this
Thirty-first Day of October, 2023

Katherine Kelly Vidal
*Director of the United States Patent and Trademark Office*